(12) United States Patent
Lee et al.

(10) Patent No.: US 8,865,320 B2
(45) Date of Patent: Oct. 21, 2014

(54) LIGHT-EMITTING DEVICE

(75) Inventors: Sun-Young Lee, Suwon-si (KR);
Jong-Hyuk Lee, Suwon-si (KR);
Young-Woo Song, Suwon-si (KR);
Joon-Gu Lee, Suwon-si (KR);
So-Young Lee, Suwon-si (KR);
Do-Young Yoon, Seoul (KR)

(73) Assignees: Samsung Display Co., Ltd.,
Giheung-Gu, Yongin, Gyeonggi-Do
(KR); **Seoul National University
Industry Foundation**,
Bongcheon-Dong, Gwanal-Gu, Seoul
(KR)

( * ) Notice: Subject to any disclaimer, the term of this patent is extended or adjusted under 35 U.S.C. 154(b) by 1727 days.

(21) Appl. No.: 12/017,455

(22) Filed: Jan. 22, 2008

(65) Prior Publication Data

US 2008/0237615 A1   Oct. 2, 2008

(30) Foreign Application Priority Data

Mar. 29, 2007   (KR) .................. 10-2007-0031085

(51) Int. Cl.
*H01L 51/54* (2006.01)
*H01L 51/52* (2006.01)
*H01L 27/32* (2006.01)

(52) U.S. Cl.
CPC ......... *H01L 51/5265* (2013.01); *H01L 27/3211* (2013.01); *Y10S 428/917* (2013.01)
USPC ........... 428/690; 428/917; 313/113; 313/504; 313/506; 257/40; 257/98; 257/E51.027; 257/E51.037; 257/E51.046; 556/450; 556/451; 528/31; 528/40; 528/43

(58) Field of Classification Search
None
See application file for complete search history.

(56) References Cited

U.S. PATENT DOCUMENTS

| | | | |
|---|---|---|---|
| 5,847,506 A | 12/1998 | Nakayama et al. | |
| 6,517,958 B1 * | 2/2003 | Sellinger et al. | 428/690 |
| 6,525,467 B1 | 2/2003 | Eida et al. | |
| 2004/0051448 A1 | 3/2004 | Matsumoto | |
| 2005/0225238 A1 * | 10/2005 | Yamazaki | 313/506 |
| 2005/0280355 A1 | 12/2005 | Lee et al. | |
| 2006/0017377 A1 | 1/2006 | Ryu | |
| 2006/0097264 A1 * | 5/2006 | Kim et al. | 257/72 |
| 2006/0214573 A1 | 9/2006 | Maeda et al. | |
| 2007/0045619 A1 * | 3/2007 | Park et al. | 257/40 |
| 2007/0046195 A1 | 3/2007 | Chin et al. | |
| 2007/0296334 A1 | 12/2007 | Matsuda | |
| 2008/0272689 A1 | 11/2008 | Ide et al. | |
| 2009/0196117 A1 | 8/2009 | Sutardja et al. | |

FOREIGN PATENT DOCUMENTS

| | | |
|---|---|---|
| EP | 1 052 708 | 11/2000 |
| JP | 8-213174 | 8/1996 |
| JP | 10-177896 | 6/1998 |
| JP | 2000-323277 | 11/2000 |
| JP | 2004-207126 | 7/2004 |
| JP | 2004-228032 | 8/2004 |
| JP | 2005-093399 | 4/2005 |
| JP | 2006-41471 | 2/2006 |
| JP | 2006-269327 | 10/2006 |
| JP | 2007-67416 | 3/2007 |
| JP | 2008-28371 | 2/2008 |
| KR | 10-2002-0001812 A | 1/2002 |
| KR | 10-2006-0007899 | 1/2006 |
| KR | 10-2006-0103112 | 9/2006 |
| KR | 10-2006-0127257 A | 12/2006 |

OTHER PUBLICATIONS

Baney et al. "Silsesquioxanes" Chem. Rev. 1995. vol. 95, pp. 1409-1430.*
Office Action issued in corresponding European Patent Application No. 09250716.9 dated Jul. 2, 2009.
JPO Office Action for corresponding Japanese Patent Application No. 2009-061494, dated Apr. 26, 2011.
Korean Registration Determination Certificate issued on Jan. 31, 2008 in the corresponding Korean Patent Application No. 10-2007-31085.
U.S. Appl. No. 12/364,005, filed Feb. 2, 2009, Myung-Song.
Abstract in English of CN 101067694, 2011.

* cited by examiner

*Primary Examiner* — Michael H Wilson
(74) *Attorney, Agent, or Firm* — Robert E. Bushnell, Esq.

(57) ABSTRACT

A light-emitting device including: a substrate; a light-emitting diode; and an optical resonance layer to resonate light emitted from the light-emitting diode. The optical resonance layer includes a first layer, including a polysilsesquioxane-based copolymer. A linking group connecting two different silicon (Si) atoms of the polysilsesquioxane-based copolymer can be —O—, or a substituted or unsubstituted $C_1$-$C_{30}$ alkylene group.

23 Claims, 17 Drawing Sheets

LIGHT

LIGHT

LIGHT-EMITTING DEVICE

CROSS-REFERENCE TO RELATED APPLICATION

This application claims the benefit of Korean Application No. 2007-31085, filed Mar. 29, 2007, in the Korean Intellectual Property Office, the disclosure of which is incorporated herein by reference.

BACKGROUND OF THE INVENTION

1. Field of the Invention

Aspects of the present invention relate to a light-emitting device, and more particularly, to a light-emitting device including an optical resonance layer including a polysilsesquioxane-based copolymer.

2. Description of the Related Art

The light efficiency of light-emitting devices, such as, liquid crystal displays, or organic light-emitting devices, is divided between an internal efficiency and an external efficiency. The internal efficiency depends on the photoelectric conversion efficiency of a light-emitting material. The external efficiency, which is also called the "light coupling efficiency", depends on the refractive index of each layer constituting the light-emitting device. Organic light-emitting devices have a lower light coupling efficiency than other devices, such as, cathode ray tubes, and plasma display panels (PDPs).

The primary reason why the light coupling efficiency of organic light-emitting devices is lower than that of other display devices, is that when light is emitted from light-emitting layers of the organic light-emitting devices, at an angle greater than a critical angle, a total internal reflection occurs at an interface between a higher refractive index layer (e.g., an ITO electrode layer), and a lower refractive index layer (e.g., a substrate), thereby hindering the extraction of light emitted from the light-emitting layers. Due to the total internal reflection, at an interface between a higher refractive index layer and a lower refractive index layer, only about ¼ of the light emitted from a light-emitting layer, of an organic light-emitting device, can be extracted to the outside.

In view of this problem, Japanese Patent Laid-Open Publications Nos. Hei. 8-250786, Hei. 8-213174, and Hei. 10-177896 disclose organic light-emitting devices based on the concept of an optical microcavity. In the organic light-emitting devices disclosed in these documents, a multi-layered translucent mirror is interposed between a glass substrate and an ITO electrode. The translucent mirror, together with a metal cathode serving as a reflective plate, serves as an optical resonator. The translucent mirror has a multi-layered structure obtained by alternately stacking a $TiO_2$ layer, with a higher refractive index, and a $SiO_2$ layer with a lower refractive index. The optical resonance function of the translucent mirror can be achieved by controlling the reflectance of the mirror, by adjusting the number of $TiO_2$ layers and $SiO_2$ layers. As the number of layers constituting the translucent mirror increases, the reflection characteristics of the translucent mirror are enhanced. Thus, it is necessary to increase the number of the layers constituting the translucent mirror. However, in order to adjust the reflectance of the translucent mirror for a predetermined wavelength, it is necessary to accurately design the number and thicknesses of the layers constituting the translucent mirror, which complicates the manufacturing process of an organic light-emitting device.

Therefore, there is much room for improvement in conventional organic light-emitting devices.

SUMMARY OF THE INVENTION

Aspects of the present invention provide a light-emitting device, which can be easily manufactured, and has improved light coupling efficiency, color purity, durability, etc., by virtue of an improved optical resonance layer.

According to an aspect of the present invention, there is provided a light-emitting device including: a substrate; a light-emitting diode disposed on the substrate; and an optical resonance layer disposed on the light-emitting diode, to resonate light emitted from the light-emitting diode The optical resonance layer includes a first layer including a polysilsesquioxane-based copolymer. A linking group connecting two different silicon (Si) atoms, of the polysilsesquioxane-based copolymer, can be —O—, or a substituted or unsubstituted $C_1$-$C_{30}$ alkylene group.

The light-emitting device can have high light coupling efficiency and color purity. In addition, the optical resonance layer has a high mechanical strength, thereby improving the durability of the light-emitting device.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the exemplary embodiments, taken in conjunction with the accompanying drawings, of which.

DETAILED DESCRIPTION OF THE EMBODIMENTS

Figure 1:
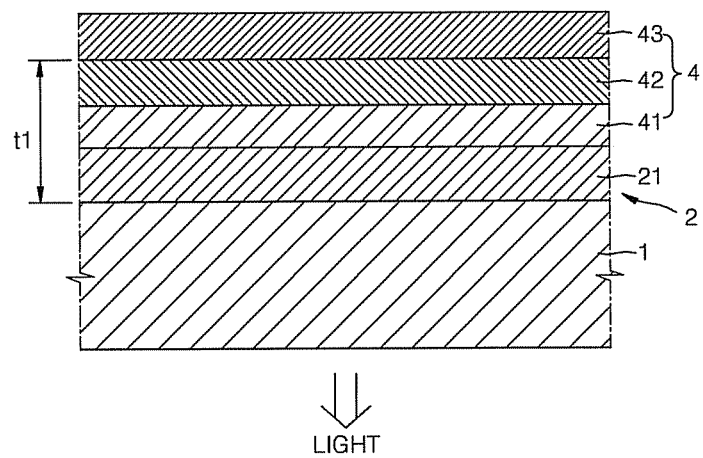
FIGS. 1 through 3 are schematic sectional views illustrating bottom-emission type organic light-emitting devices, according to exemplary embodiments of the present invention.

Reference will now be made in detail to the exemplary embodiments of the present invention, examples of which are illustrated in the accompanying drawings, wherein like reference numerals refer to the like elements throughout. The exemplary embodiments are described below, in order to explain the aspects of the present invention, by referring to the figures. Additionally, when a first element is said to be "disposed" on a second element, the first element can directly contact the second element, or one or more other elements can be located therebetween.

FIG. 1 is a schematic sectional view illustrating a bottom-emission type organic light-emitting device, according to an exemplary embodiment of the present invention. Referring to FIG. 1, the light-emitting device includes a substrate 1, an optical resonance layer 2, and a light-emitting diode 4, which are sequentially stacked. Light emitted from the light-emitting diode 4 is extracted from the substrate 1, via the optical resonance layer 2. Although not shown, a sealing member (e.g., a glass, a film, or a metal cap) to seal the light-emitting diode 4, may be additionally disposed on the light-emitting diode 4. For convenience of illustration, schematic structures of organic light-emitting devices, in which sealing members are omitted, will be described in the following exemplary embodiments of the present invention.

The substrate 1 may be a transparent glass substrate including $SiO_2$ as a main component. Although not shown in FIG. 1, a buffer layer may be further disposed on the substrate 1, in order to make the substrate 1 smooth, and to exclude impurity elements. The buffer layer may be made of $SiO_2$ and/or SiNx, or the like. A substrate material is not limited to the above-described example. For example, the substrate 1 may also be made of a transparent plastic material.

The light-emitting diode 4 disposed on the substrate 1, includes first and second electrodes 41 and 43 facing each other, and a light-emitting layer 42 interposed between the first and second electrodes 41 and 43. The first electrode 41 may be made of a transparent conductive material, e.g., ITO, IZO, $In_2O_3$, or ZnO, and may be patterned using photolithography.

In passive matrix (PM) organic light-emitting devices, the patterns of the first electrode 41 may be stripe-patterned lines that are separated from each other by a predetermined distance. In active matrix (AM) organic light-emitting devices, the patterns of the first electrode 41 may be formed to correspond to pixels. Furthermore, in AM organic light-emitting devices, a thin film transistor (TFT) layer including at least one TFT, is additionally disposed on the substrate 1, below the first electrode 41, and the first electrode 41 is electrically connected to the TFT layer. Such PM and AM organic light-emitting devices will be described below, in more detail.

The first electrode 41, provided as a transparent electrode, may be connected to an external terminal (not shown), so as to be used as an anode. The second electrode 43 may be a reflective electrode. The second electrode 43 may be made of Al, Ag, Mg, and/or Ca, but is not limited thereto. The second electrode 43 may be connected to an external second electrode terminal (not shown), so as to be used as a cathode.

In PM organic light-emitting devices, the second electrode 43 may be formed as stripe-patterned lines that are perpendicular to the patterns of the first electrode 41. In AM organic light-emitting devices, the second electrode 43 may be formed to entirely cover active regions to realize images. A detailed description thereof will be provided later.

The first electrode 41 and the second electrode 43 may also be used as a cathode and an anode, respectively. The light-emitting layer 42, interposed between the first electrode 41 and the second electrode 43, emits light when the first electrode 41 and the second electrode 43 are electrically operated.

The light-emitting layer 42 may include an organic material or an inorganic material. When the light-emitting layer 42 includes an organic material, a low molecular weight organic material, and a polymer organic material, can be used.

The light-emitting layer 42 may further include at least one layer selected from the group consisting of a hole injection layer (HIL), a hole transport layer (HTL), an electron blocking layer (EBL), an organic light-emitting layer (EML), a hole blocking layer (HBL), an electron transport layer (ETL), and an electron injection layer (EIL). The light-emitting layer 42 may be made of a low molecular weight organic material. For example, the low molecular weight organic material may be copper phthalocyanine (CuPc), N,N'-di(naphthalene-1-yl)-N,N'-diphenyl-benzidine (NPB), tris-8-hydroxyquinoline aluminum (Alq3), or the like, but is not limited thereto. When forming the light-emitting layer 42 using the low molecular weight organic material, various methods, e.g., deposition or sputtering, can be used.

The light-emitting layer 42 may also be made of a polymer organic material. For example, the polymer organic material may be poly-(2,4)-ethylene-dihydroxy thiophene (PEDOT), polyaniline (PANI), or the like, but is not limited thereto. When forming the light-emitting layer 42 using the polymer organic material, inkjet printing, spin-coating, laser-assisted thermal transfer, or the like, can be used.

When the light-emitting layer 42 includes an inorganic material, alkaline earth sulfides, e.g., ZnS, SrS, CaS, $CaCa_2S_4$, $SrCa_2S_4$, or $BaAl_2S_4$, and emission center elements, including transition metals and alkaline rare earth metals, e.g., Mn, Ce, Tb, Eu, Tm, Er, Pr, or Pb, may be used. An insulating layer may be formed between the light-emitting layer 42 and the first electrode 41, and between the light-emitting layer 42 and the second electrode 43.

In the light-emitting device of FIG. 1, light emitted from the light-emitting layer 42, of the light-emitting diode 4, is discharged from the substrate 1, via the optical resonance layer 2. The optical resonance layer 2 may include a first layer 21 that includes a polysilsesquioxane-based copolymer.

A linking group connecting two different silicon atoms in the polysilsesquioxane-based copolymer can be —O—, a substituted or unsubstituted $C_1$-$C_{30}$ alkylene group, or a combination thereof. The linking group can be, for example, a $C_1$-$C_{10}$ alkylene group. Generally, at least one of the linking groups is a substituted or unsubstituted $C_1$-$C_{30}$ alkylene group, for example a $C_1$-$C_{10}$ alkylene group. That is, the polysilsesquioxane-based copolymer may have a —(Si—

—O—Si)— bond and a —(Si-$Q_1$-Si)— bond, where $Q_1$ is a substituted or unsubstituted $C_1$-$C_{30}$ alkylene group, but generally has at least one —(Si-$Q_1$-Si)— bond.

An end group of the polysilsesquioxane-based copolymer may be at least one selected from the group consisting of a hydroxyl group, a substituted or unsubstituted $C_1$-$C_{30}$ alkyl group, and a substituted or unsubstituted $C_1$-$C_{30}$ alkoxy group. For example, the end group of the polysilsesquioxane-based copolymer may be at least one selected from the group consisting of a hydroxyl group, a $C_1$-$C_{10}$ alkyl group, and a $C_1$-$C_{10}$ alkoxy group.

In formulae used herein, examples of an unsubstituted $C_1$-$C_{30}$ alkyl group include methyl, ethyl, propyl, isobutyl, sec-butyl, pentyl, iso-amyl, and hexyl groups. At least one hydrogen atom of the alkyl group may be substituted by a halogen atom, a hydroxyl group, a nitro group, a cyano group, an amino group, an amidino group, hydrazine, hydrazone, a carboxyl group or its salt, a sulfonyl group or its salt, a phosphonyl group or its salt, a $C_1$-$C_{30}$ alkyl group, a $C_1$-$C_{30}$ alkenyl group, a $C_1$-$C_{30}$ alkynyl group, a $C_6$-$C_{30}$ aryl group, a $C_7$-$C_{20}$ arylalkyl group, a $C_2$-$C_{20}$ heteroaryl group, or a $C_3$-$C_{30}$ heteroarylalkyl group.

In formulae used herein, examples of an unsubstituted $C_1$-$C_{30}$ alkoxy group include methoxy, ethoxy, phenyloxy, cyclohexyloxy, naphthyloxy, isopropyloxy, and diphenyloxy groups. At least one hydrogen atom of the alkoxy group may be substituted by the same substituents as recited in the above definition of the alkyl group.

In formulae used herein, an unsubstituted $C_1$-$C_{30}$ alkylene group refers to a divalent linking group having the same structure as the alkyl group defined above. At least one hydrogen atom of the alkylene group may be substituted by the same substituents as recited in the above definition of the alkyl group.

The polysilsesquioxane-based copolymer may have various shapes. For example, the polysilsesquioxane-based copolymer may be formed in a random shape, a trapezoidal shape, or a cage shape, but is not limited thereto. The polysilsesquioxane-based copolymer included in the first layer 21, may be a product obtained by a condensation reaction between a monomer represented by Formula 1 below, and a monomer represented by Formula 2 below, or a product obtained by a condensation reaction of monomers represented by Formula 2 below:

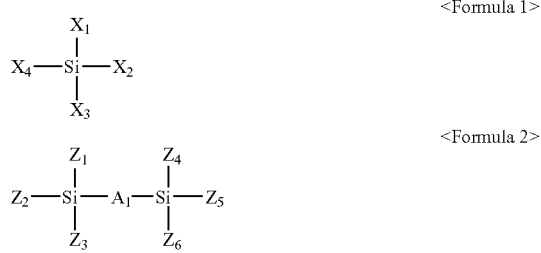

wherein $X_1$, $X_2$, $X_3$, $X_4$, $Z_1$, $Z_2$, $Z_3$, $Z_4$, $Z_5$, and $Z_6$ may be each independently a hydroxyl group, a substituted or unsubstituted C1-C30 alkyl group, or a substituted or unsubstituted C1-C30 alkoxy group. For example, hydroxyl group, a C1-C10 alkyl group, or a C1-C10 alkoxy group.

In Formulae 1 and 2, $A_1$ is a substituted or unsubstituted $C_1$-$C_{30}$ alkylene group. According to some embodiments a $C_1$-$C_{10}$ alkylene group is used.

The condensation reaction of the monomers of Formulae 1 and 2, can be performed using any one of various known methods. For example, various known acid catalysts, base catalysts, etc. may be used. A reaction temperature for the condensation reaction may vary, according to the monomers used, but may be selected from temperatures ranging from about 40 to 60° C.

The polysilsesquioxane-based copolymer may be a product obtained by a condensation reaction between the monomer of Formula 1 and the monomer of Formula 2, at a molar ratio of from 1:9 to 9:1, for example, at a molar ratio of from 1:3 to 3:1. When this molar ratio is satisfied, it is possible to form the first layer 21 with an appropriate film hardness and refractive index.

As described above, the polysilsesquioxane-based copolymer included in the first layer 21, includes a substituted or unsubstituted $C_1$-$C_{30}$ alkylene group, in addition to —O—, as a linking group connecting two different silicon atoms. The polysilsesquioxane-based copolymer may have an alkyl group as an end group. The alkyl group can create free volumes in the polysilsesquioxane-based copolymer, to form intrinsic pores, and thus, the first layer 21 can have a very low refractive index. In more detail, the refractive index of the first layer 21, including the polysilsesquioxane-based copolymer, may be from 1.3 to 1.5. Therefore, the light-emitting device including the optical resonance layer 2 including the first layer 21, can exhibit an improved external efficiency.

Since the polysilsesquioxane-based copolymer includes a substituted or unsubstituted $C_1$-$C_{30}$ alkylene group, as a linking group connecting two different silicon atoms, the first layer 21, including the polysilsesquioxane-based copolymer, can exhibit an improved mechanical strength. In more detail, the hardness of the first layer 21 may be from 7.5 to 30 GPa. As such, the first layer 21 has a high hardness, even when another film, e.g., the first electrode 41, is formed on the first layer 21 using deposition or sputtering. A reduction of a film thickness and/or film cracking that may be caused due to shrinkage of the first layer 21, does not occur. In addition, the first layer 21 has a good chemical resistance to a developer (e.g., a strong alkaline solution, such as KOH) used in patterning a film disposed on the first layer 21. Thus, when the first electrode 41 is patterned using a developer, delamination of the first electrode 41, due to dissolution of the first layer 21, can be prevented.

The polysilsesquioxane-based copolymer included in the first layer 21 may have a weight average molecular weight of 1,000 to 100,000, for example, 3,000 to 9,000. When the weight average molecular weight of the polysilsesquioxane-based copolymer is 1,000 or more, the durability of the first layer 21 can be enhanced. When the weight average molecular weight of the polysilsesquioxane-based copolymer is 100,000 or less, gelation of the polysilsesquioxane-based copolymer can be prevented.

The first layer 21, including the polysilsesquioxane-based copolymer, can be formed using a very simple process, e.g., spin-coating or dip-coating. For example, first, as described above, a polysilsesquioxane-based copolymer (hereinafter, referred to as "polysilsesquioxane-based copolymer A") is obtained by a condensation reaction between a monomer of Formula 1 and a monomer of Formula 2. Then, a mixture including the polysilsesquioxane-based copolymer A is spin-coated on an area intended to form the first layer 21, and is thermally treated, to obtain the first layer 21 including a second polysilsesquioxane-based copolymer (hereinafter, referred to as "polysilsesquioxane-based copolymer B"). The polysilsesquioxane-based copolymer A has —O— or a substituted or unsubstituted $C_1$-$C_{30}$ alkylene group between two silicon atoms, but can be dissolved in a solvent (e.g., butanol, pentanol, or MIBK), due to its low average molecular weight, and can be spin-coated. When the polysilsesquioxane-based copolymers A are coated and thermally treated, cross-linking occurs between the polysilsesquioxane-based copolymers A, to thereby form the polysilsesquioxane-based copolymer B. The polysilsesquioxane-based copolymer B is included in the first layer 21.

The first layer 21, including the polysilsesquioxane-based copolymer, may further include a nanoporous material. The nanoporous material is a material having nano-sized pores. When the nanoporous material is included in the first layer 21, an air layer can be introduced into the first layer 21, due to the nano-sized pores. Air is known to have a low refractive index. Thus, when the nanoporous material is included in the first layer 21, the refractive index of the first layer 21 can be further reduced. For example, the nanoporous material may be nanoporous silica, silica aerogel, polycaprolactone, cyclodextrin, or the like, but is not limited thereto. As described above, when the first layer 21 further includes the nanoporous material, in addition to the polysilsesquioxane-based copolymer, the refractive index of the first layer 21 can be reduced to 1.0.

The second electrode 43 of the light-emitting diode 4 may be formed as a reflective film. In this case, the optical resonance layer 2 is positioned to be opposite to the second electrode 43, with respect to the light-emitting layer 42 of the light-emitting diode 4. By doing so, light emitted from the light-emitting layer 42 is reflected from the second electrode 43, and then extracted from the substrate 1, via the optical resonance layer 2. Optical resonance occurs between a reflective lower surface of the second electrode 43, and an interface between the first layer 21, included in the optical resonance layer 2, and the substrate 1. That is, optical resonance occurs in a space between the reflective lower surface of the second electrode 43, and a lower surface of the first layer 21, included in the optical resonance layer 2. The space has a thickness t1. The thickness t1 is determined by Equation 1 below:

$$t1=(n\lambda)/2 \qquad \text{<Equation 1>}$$

wherein λ is a wavelength of light emitted from the light-emitting layer 42, and n is a natural number.

The thickness, of the first layer 21 including the polysilsesquioxane-based copolymer, may be selected from the thickness range which satisfies Equation 1 above.

Figure 2:
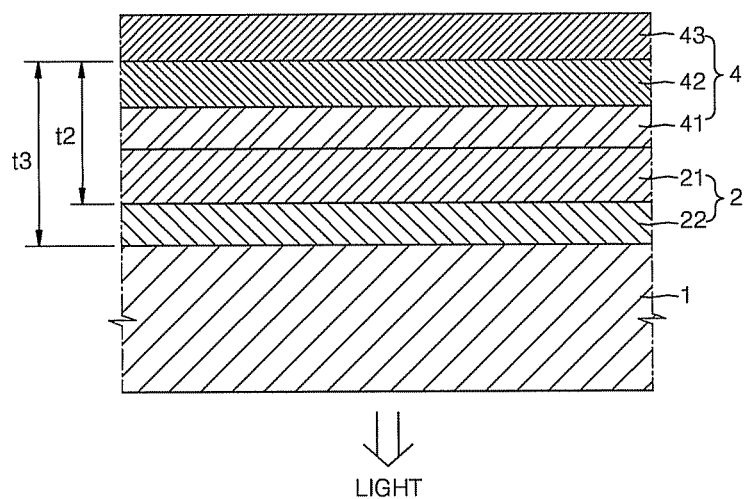

FIG. 2 illustrates a light-emitting device, according to another exemplary embodiment of the present invention. Referring to FIG. 2, an optical resonance layer 2 and a light-emitting diode 4 are sequentially stacked on a substrate 1. The substrate 1 and the light-emitting diode 4 are as described above.

The optical resonance layer 2 includes a first layer 21, including a polysilsesquioxane-based copolymer, and a second layer 22 having a higher refractive index than the first layer 21. The first layer 21 and the second layer 22 are sequentially stacked, such that the second layer 22 is further from the light-emitting diode 4 than the first layer 21.

A refractive index difference, between the first layer 21 and the second layer 22, is 0.2, or more, for example, 0.4 or more, in order to enhance a light coupling efficiency. The refractive index of the second layer 22 may range from 1.6 to 2.3, for example, from 1.8 to 2.3. The second layer 22 may be made of silicon nitride (SiNx), titanium oxide ($TiO_2$), hafnium dioxide ($HfO_2$), niobium oxide ($Nb_2O_5$), tantalum oxide ($Ta_2O_5$), antimony oxide ($Sb_2O_3$), benzocyclobuten (BCB), titanium alkoxide ($Ti(OC_nH_{2n+1})$), or the like, but is not limited thereto.

Light emitted from a light-emitting layer 42 is optically resonated by the optical resonance layer 2. As illustrated in FIG. 2, the optical resonance occurs between a lower surface of a second electrode 43, and an interface between the first layer 21 including the polysilsesquioxane-based copolymer, and the second layer 22 that has a higher refractive index than the first layer 21. The optical resonance also occurs between the lower surface of the second electrode 43, and an interface between the second layer 22 and the substrate 1.

The optical resonance can enhance the coupling efficiency of light emitted from the light-emitting layer 42, of the light-emitting diode 4. A resonance thickness, capable of inducing the optical resonance, can be represented by t2 and t3, as illustrated in FIG. 2. In detail, t2 is a thickness of a space between the lower surface of the second electrode 43, and the interface between the first layer 21 and the second layer 22, and t3 is a thickness of a space between the lower surface of the second electrode 43, and the interface between the second layer 22 and the substrate 1. The thicknesses t2 and t3 can be respectively determined by Equations 2 and 3 below:

$$t2=(n\lambda)/2 \qquad \text{<Equation 2>}$$

$$t3=(2n+1)\lambda/4 \qquad \text{<Equation 3>}$$

wherein λ is a wavelength of light emitted from the light-emitting layer 42, and n is a natural number.

The thicknesses of the first layer 21 and the second layer 22, included in the optical resonance layer 2, can be selected from the thickness ranges which satisfy Equations 2 and 3 above.

Figure 3:
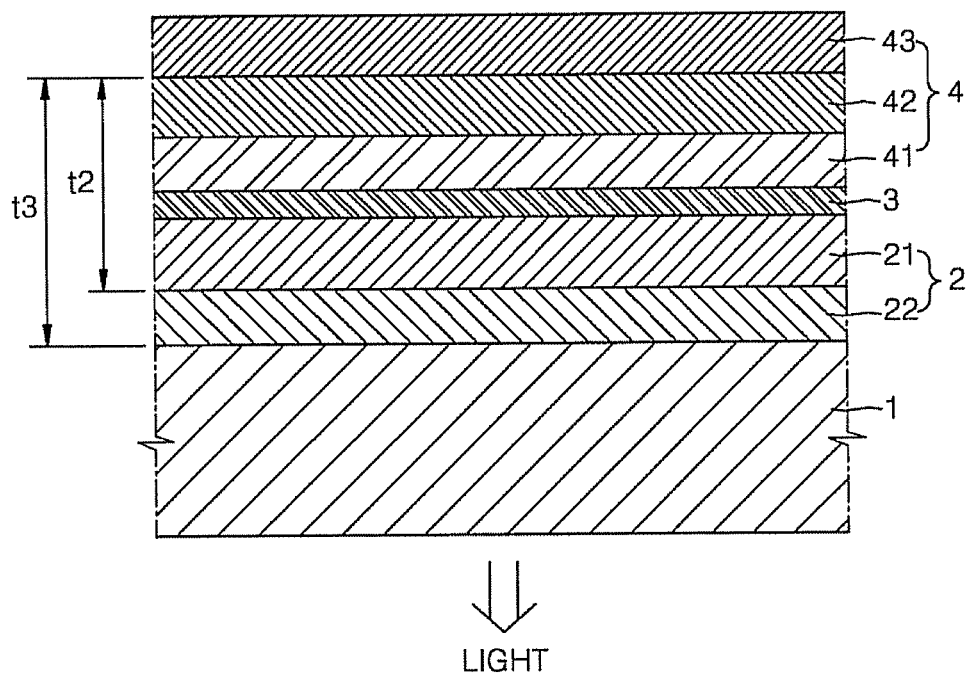

FIG. 3 illustrates a light-emitting device, according to another exemplary embodiment of the present invention. Referring to FIG. 3, an optical resonance layer 2 and a light-emitting diode 4 are sequentially stacked on a substrate 1. An interlayer 3 is further interposed between the optical resonance layer 2 and the light-emitting diode 4. The optical resonance layer 2 includes a first layer 21 that includes a polysilsesquioxane-based copolymer, and a second layer 22 having a higher refractive index than the first layer 21. The substrate 1, the light-emitting diode 4, and the optical resonance layer 2 are as described above.

The interlayer 3 is interposed between the optical resonance layer 2 and the light-emitting diode 4, to serve as a passivation layer, to prevent the penetration of oxygen and moisture into the light-emitting diode 4 from the substrate 1. The interlayer 3 may serve as a planarization layer, to planarize a surface of the optical resonance layer 2. The interlayer 3 can perform various other operations. For example, an optical resonance can occur, due to a total internal reflection between the interlayer 3, and the first layer 21 including the polysilsesquioxane-based copolymer. The interlayer 3 may have a thickness of about 20 nm, and may be made of an inorganic-organic hybrid polymer (ORMOCER), silicon oxide ($SiO_2$), benzocyclobuten (BCB), silicon nitride ($Si_3N_4$), or the like.

In FIG. 3, thicknesses t2 and t3 are determined by Equations 2 and 3 above, and the thickness of the interlayer 3 is selected from a range of thicknesses which satisfies Equations 2 and 3 above.

Figure 5:
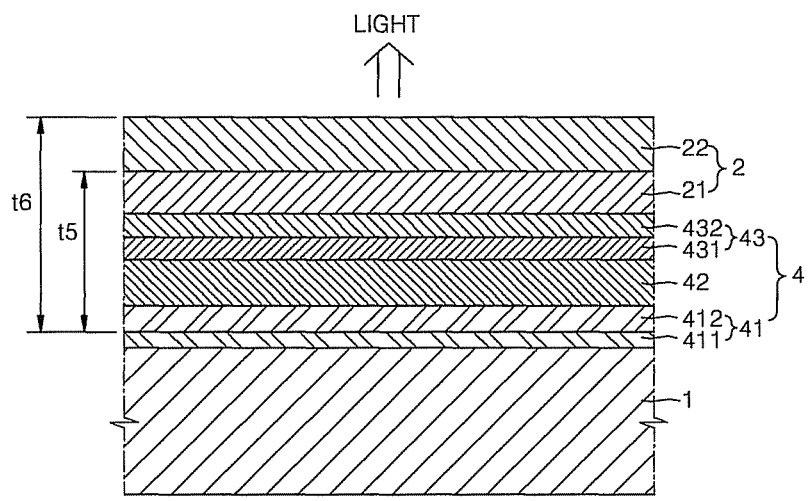
Figure 6:
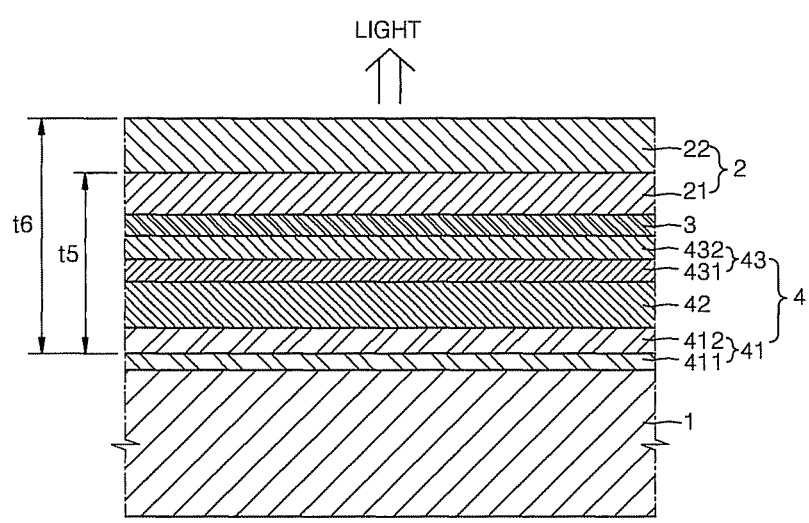

The exemplary embodiments described with reference to FIGS. 1, 2, and 3 have been illustrated in terms of bottom-emission type light emitting devices, in which light is emitted in the direction of a substrate, but the present invention is not limited thereto. The exemplary embodiments described with reference to FIGS. 1, 2, and 3 can also be applied to top-emission type light-emitting devices, as illustrated in FIGS. 4, 5, and 6.

Figure 4:
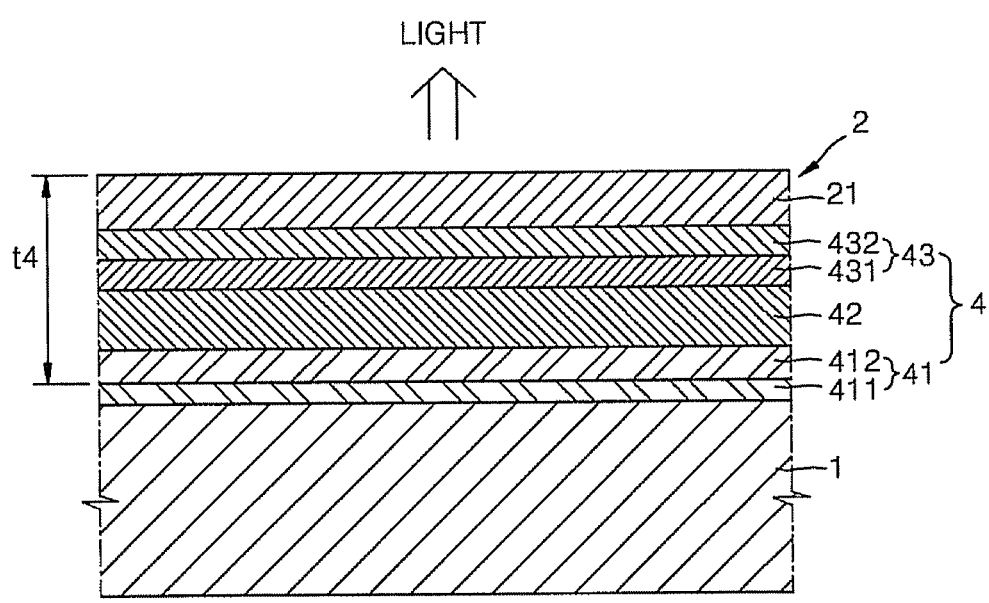
FIGS. 4 through 6 are schematic sectional views illustrating top-emission type organic light-emitting devices, according to exemplary embodiments of the present invention.

FIG. 4 illustrates a light-emitting device, according to another exemplary embodiment of the present invention. Referring to FIG. 4, a light-emitting diode 4 and an optical resonance layer 2 are sequentially stacked on a substrate 1.

A first electrode 41, of the light-emitting diode 4, includes a first reflective electrode 411, and a first transparent electrode 412. The first reflective electrode 411 may be made of Ag, Mg, Al, Pt, Pd, Au, Ni, Nd, Ir, Cr, or a combination thereof, and the first transparent electrode 412 may be made of a material having a high work function, e.g., ITO, IZO, ZnO, or $In_2O_3$.

A second electrode 43 may be a transmissive electrode, and may include a second metal electrode 431, which is translucent and has a low work function, and a second transparent electrode 432 disposed on the second metal electrode 431. The second metal electrode 431 may be made of Li, Ca, LiF/Ca, LiF/Al, Al, Mg, or a combination thereof, and the second transparent electrode 432 may be made of ITO, IZO, ZnO, $In_2O_3$, or the like.

A light-emitting layer 42 is as described above. The optical resonance layer 2 includes a first layer 21 including a polysilsesquioxane-based copolymer. The polysilsesquioxane-based copolymer is as described above.

Optical resonance occurs between an upper surface of the first reflective electrode 411, of the first electrode layer 41, and an upper surface of the first layer 21. A space in which the optical resonance occurs has a thickness t4. The thickness t4 can be determined by Equation 4 below:

$$t4=(n\lambda)/2 \qquad \text{<Equation 4>}$$

wherein $\lambda$ is a wavelength of light emitted from the light-emitting diode 4, and n is a natural number. The thickness of the optical resonance layer 2 can be selected from the thickness range which satisfies Equation 4 above.

FIG. 5 illustrates a light-emitting device, according to another exemplary embodiment of the present invention. Referring to FIG. 5, an optical resonance layer 2 includes a first layer 21, including a polysilsesquioxane-based copolymer as described above, and a second layer 22 having a higher refractive index than the first layer 21. The first layer 21 and the second layer 22 are sequentially stacked, such that the second layer 22 is further from the light-emitting diode 4 than the first layer 21. The second layer 22 is as described above.

In the light-emitting device of FIG. 5, optical resonance occurs between an upper surface of a first reflective electrode 411, of a first electrode 41, and an interface between the first layer 21 and the second layer 22. Optical resonance also occurs between the upper surface of the first reflective electrode 411 of the first electrode 41 and an upper surface of the second layer 22.

Spaces in which the optical resonance occurs have thicknesses of t5 and t6, as illustrated in FIG. 5. In more detail, t5 is a thickness of the space between the upper surface of the first reflective electrode 411, of the first electrode 41, and the interface between the first layer 21 and the second layer 22. The t6 thickness represents the space between the upper surface of the first reflective electrode 411, of the first electrode 41, and the upper surface of the second layer 22. The thicknesses t5 and t6 can be determined by Equations 7 and 8 below:

$$t5=(n\lambda)/2 \qquad \text{<Equation 7>}$$

$$t6=(2n+1)\lambda/4 \qquad \text{<Equation 8>}$$

wherein $\lambda$ is a wavelength of light emitted from the light-emitting diode 4, and n is a natural number.

The thicknesses of the first layer 21 and the second layer 22 can be selected from the thicknesses ranges which satisfy Equations 7 and 8 above.

FIG. 6 illustrates a light-emitting device according, to another exemplary embodiment of the present invention. The light-emitting device of the embodiment of FIG. 6 is similar to the light-emitting device illustrated in FIG. 5, except that an interlayer 3 is interposed between a light-emitting diode 4 and an optical resonance layer 2. Thus, the description about the light-emitting device illustrated in FIG. 5 except the interlayer 3, can be referred to. The interlayer 3 is as described above with reference to FIG. 3.

A light-emitting diode of a light-emitting device, according to the exemplary embodiments of the present invention, includes red, green, and blue subpixels, respectively including red, green, and blue light-emitting layers. The thickness of a portion of a first layer, corresponding to the red subpixel, may be different from the thickness of a portion of the first layer corresponding to the green subpixel. The thickness of the portion of the first layer, corresponding to the green subpixel, may be different from the thickness of a portion of the first layer corresponding to the blue subpixel. The thickness of the portion of the first layer, corresponding to the blue subpixel, may be different from the thickness of the portion of the first layer corresponding to the red subpixel. The first layer may also have different thicknesses for the red, green, and blue subpixels.

Figure 7:
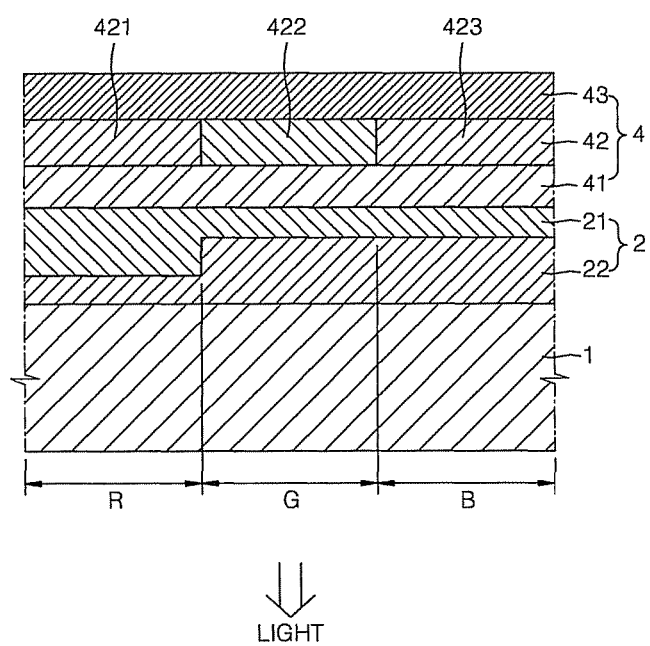
FIGS. 7 and 8 are sectional views illustrating the bottom-emission type organic light-emitting device of FIG. 2, wherein an optical resonance layer has a different thickness for each subpixel.

FIG. 7 illustrates a light-emitting device according to another exemplary embodiment of the present invention. The light-emitting device of the embodiment of FIG. 7 is similar to the light-emitting device illustrated in FIG. 2, except that a light-emitting layer 42 includes a red light-emitting layer 421, a green light-emitting layer 422, and a blue light-emitting layer 423; and a red subpixel R, a green subpixel G, and a blue subpixel B are shown. FIG. 7 illustrates that the thicknesses of portions of a first layer 21, corresponding to the green subpixel G, and the blue subpixel B, are different from the thickness of a portion of the first layer 21, corresponding to the red subpixel R.

Figure 8:
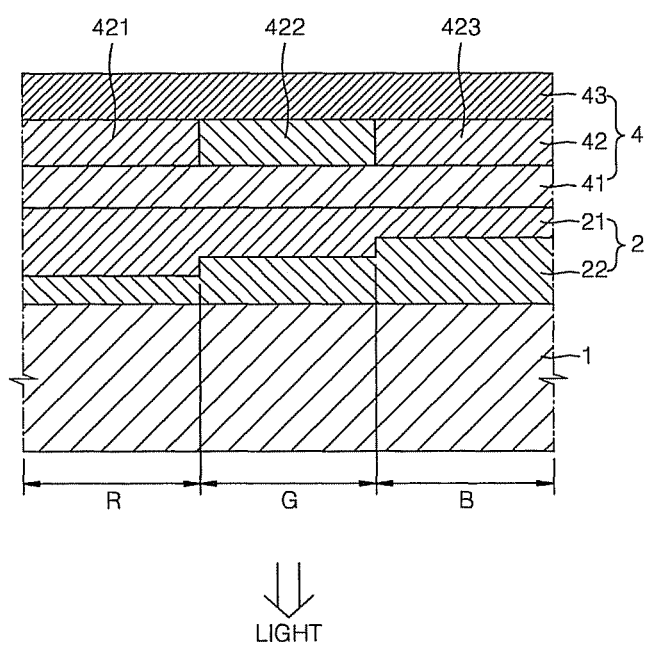

A light-emitting device of FIG. 8 is similar to the light-emitting device of FIG. 7. However, FIG. 8 illustrates that the thicknesses of portions of a first layer 21, corresponding to a red subpixel R, a green subpixel G, and a blue subpixel B, are different from each other.

Generally, light-emitting regions corresponding to a red subpixel, a green subpixel, and a blue subpixel, have different emission spectra and emission wavelengths, and thus, a resonance thickness, capable of maximizing emission efficiency, is different for the red, green, and blue subpixels. In this regard, referring to FIG. 8, the thickness of the first layer 21 can be adjusted, according to the red subpixel R, the green subpixel G, and the blue subpixel B, in order to maximize the efficiencies of the red subpixel R, the green subpixel G, and the blue subpixel B, of a particular light-emitting device.

Referring to FIGS. 7 and 8, a second layer 22 may be formed using, e.g., a conventional dry etching process, so that the second layer 22 has a stepped structure. Then, a mixture including a polysilsesquioxane-based copolymer, as described above, is coated on the second layer 22, and thermally treated to form a first layer 21. The light-emitting devices, as illustrated in FIGS. 7 and 8, are thereby completed.

Although not shown, an adjustment of the thickness of a first layer, according to subpixels as described above with reference to FIGS. 7 and 8, can be applied to the light-emitting devices illustrated in FIGS. 1 and 3 through 6.

Figure 9:
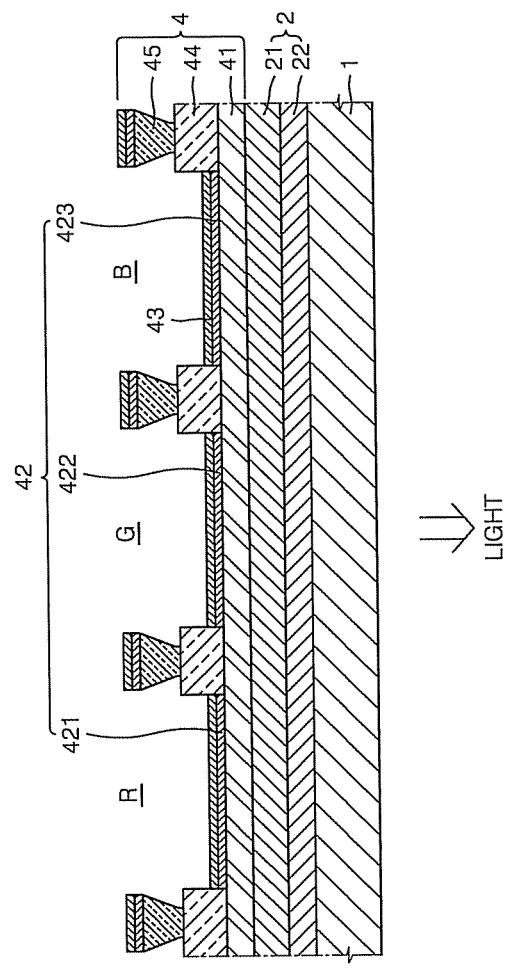
FIGS. 9 and 10 are sectional views illustrating bottom-emission type passive matrix (PM) organic light-emitting devices, according to exemplary embodiments of the present invention.

FIG. 9 illustrates a PM organic light-emitting device, according to an exemplary embodiment of the present invention. Referring to FIG. 9, an optical resonance layer 2, of the organic light-emitting device includes a first layer 21, and a second layer 22 having a higher refractive index than the first layer 21. Light emitted from a light-emitting diode 4 advances toward a substrate 1. Here, the first layer 21 includes a polysilsesquioxane-based copolymer as described above, and thus, has a very low refractive index. Thus, even when a first electrode 41, of the light-emitting diode 4, is disposed on the first layer 21, damage to the first layer 21 may not occur. Moreover, the first layer 21 has a good resistance to a developer used for patterning the first electrode 41, of the light-emitting diode 4. Thus, dissolution of the first layer 21 does not occur during development, thereby preventing delamination of the first electrode 41.

The first electrode 41 is patterned into a striped shape, on the optical resonance layer 2, and an internal insulating layer 44 is disposed on the first electrode 41, to partition the first electrode 41 in a lattice shape. A separator 45 is disposed on the internal insulating layer 44, to be perpendicular to the first electrode 41, so as to pattern a light-emitting layer 42 and a second electrode 43. By virtue of the separator 45, the light-emitting layer 42 and the second electrode 43 are patterned, so as to intersect with the first electrode 41.

Figure 10:
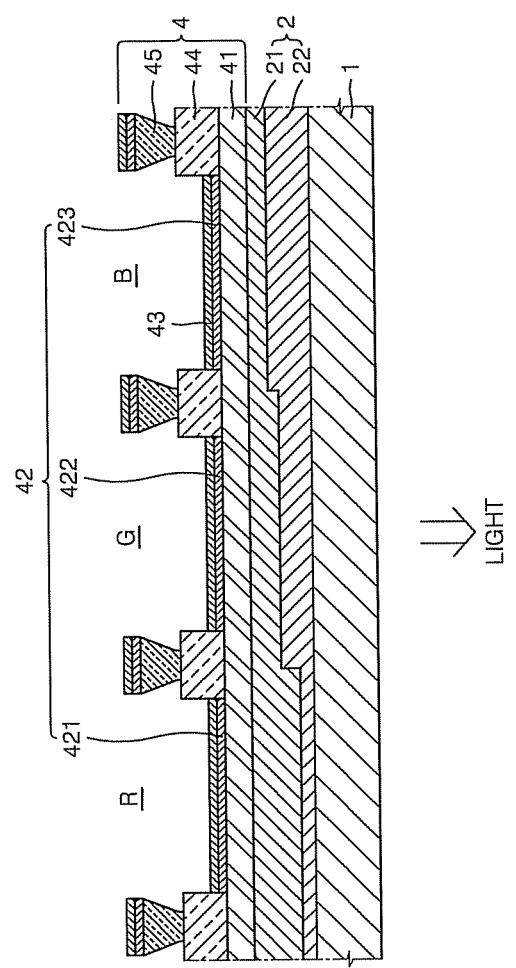
Figure 11:
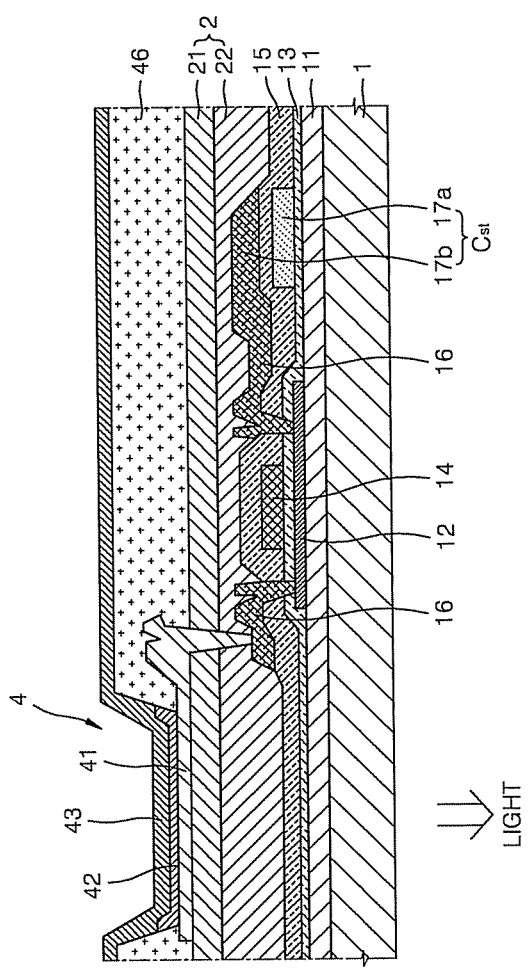
FIGS. 11 and 12 are sectional views illustrating bottom-emission type active matrix (AM) organic light-emitting devices according to exemplary embodiments of the present invention.
Figure 12:
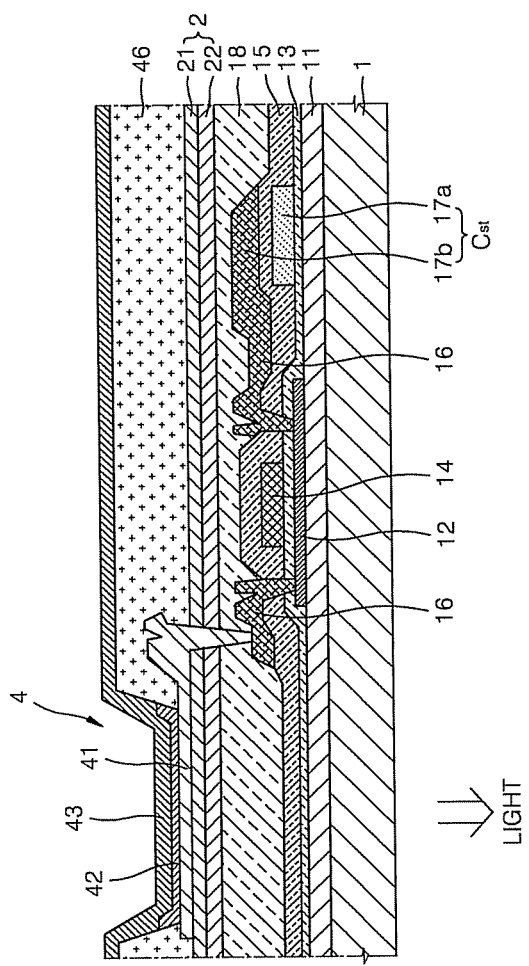
Figure 13:
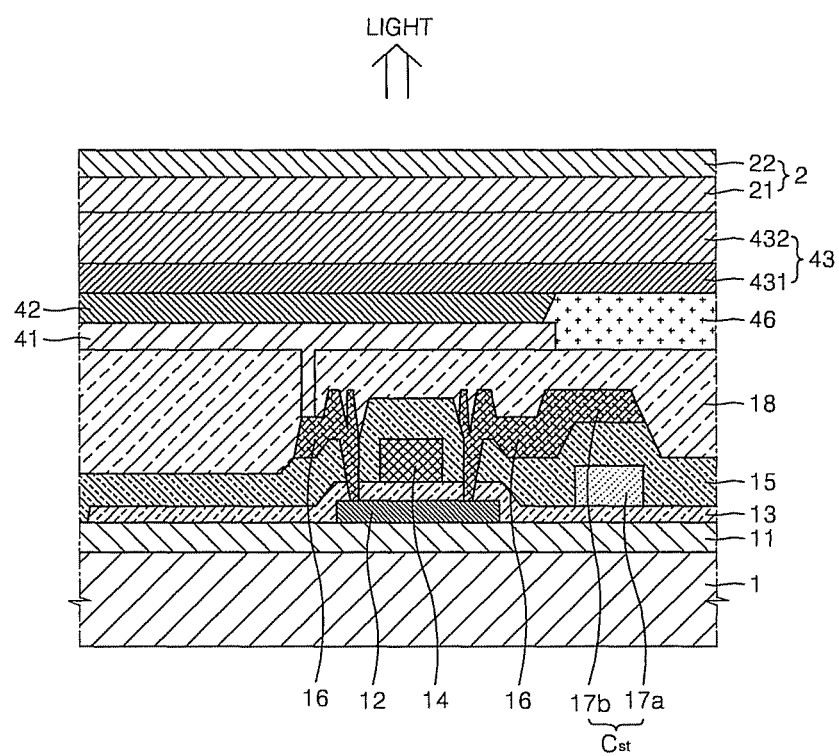
FIG. 13 is a sectional view illustrating a top-emission type AM organic light-emitting device, according to an exemplary embodiment of the present invention.

FIG. 10 is a modified exemplary embodiment of the light-emitting device illustrated in FIG. 9. The thickness of a first layer 21 varies according to red, green, and blue subpixels. FIGS. 11 through 13 illustrate AM organic light-emitting devices, according to other exemplary embodiments of the present invention. FIG. 11 illustrates a bottom-emission type, organic light-emitting device, in which light is emitted in the direction of a substrate, and each subpixel includes at least one TFT In more detail, referring to FIG. 11, a buffer layer 11 is disposed on a substrate 1, and a TFT and a capacitor Cst are disposed on the buffer layer 11. A semiconductor active layer 12, of a predetermined pattern, is disposed on the buffer layer 11. A gate insulating layer 13, made of $SiO_2$, $SiN_x$, or the like, is disposed on the semiconductor active layer 12, and a gate electrode 14 is disposed on a predetermined portion of the gate insulating layer 13. The gate electrode 14 is connected to a gate line (not shown), which supplies a TFT on/off signal. An inter-insulating layer 15 is disposed on the gate electrode 14, and source/drain electrodes 16 are disposed to contact source/drain regions of the semiconductor active layer 12, via contact holes.

An electrode 17a of the capacitor Cst is formed simultaneously with the gate electrode 14. Another electrode 17b of the capacitor Cst is formed simultaneously with the source/drain electrodes 16. The structures of the TFT and the capacitor Cst can be modified in various ways, and the shown structures are examples only.

The TFT and the capacitor Cst are covered and protected with a passivation layer. In the exemplary embodiment illustrated in FIG. 11, a second layer 22, of an optical resonance layer 2, is formed as the passivation layer. In detail, the second layer 22 may be formed by plasma-enhanced chemical vapor deposition (PECVD), using highly refractive $Si_3N_4$. A first layer 21, including a polysilsesquioxane-based copolymer as described above, is disposed on the second layer 22.

A first electrode layer 41 serving as an anode is disposed on the first layer 21, and is covered with a pixel defined layer 46 made of an organic material. An opening is formed in the pixel defined layer 46, and a light-emitting layer 42 is disposed in a region defined by the opening. Finally, a second electrode layer 43 is disposed to wholly cover pixels of the pixel defined layer 46.

The structure of such an AM organic light-emitting device can be modified in various ways. An example thereof is illustrated in FIG. 12. Referring to FIG. 12, a passivation layer 18, made of a methylsilsesquioxane (MSQ) having a low refractive index, is used, unlike the embodiment of FIG. 11, which uses a second layer as a passivation layer. The passivation layer 18 may be covered with a second layer 22. A first layer 21 may be disposed on the second layer 22. The other constitutional elements are as described above.

FIG. 13 illustrates a top-emission type, organic light-emitting device, in which light emitted from a light-emitting layer 42 advances away from a substrate 1. Here, the structures of a TFT and a capacitor Cst are as described above. The TFT and the capacitor Cst are covered and planarized with a passivation layer 18. Here, the passivaton layer 18 may be formed as a single- or multi-layered structure, using an inorganic material and/or an organic material.

A reflective first electrode layer 41 is formed in a predetermined pattern, on the passivation layer 18. A pixel defined layer 46 is disposed to cover an edge of the first electrode layer 41. The light-emitting layer 42 is disposed in an opening defined by the pixel defined layer 46. A second electrode layer 43 is disposed to cover the light-emitting layer 42 and the pixel define layer 46. The second electrode layer 43 may be formed as a transmissive electrode, as described above, and may include a second metal electrode 431 made of a metal with a low work function, and a second transparent electrode 432 covering the second metal electrode 431.

An optical resonance layer 2 is disposed on the second electrode layer 43. In the above structure, the optical resonance layer 2 also serves as a passivation layer of a light-emitting diode.

The above-described PM and AM structures, of FIGS. 9 through 13, have been illustrated as having an optical resonance layer, including both a first layer and a second layer, but the present invention is not limited thereto. It should be understood that an optical resonance layer, including only a first layer, is also within the scope of the present invention.

The embodiments of FIGS. 9 through 11 illustrate only a single pixel. In a full-color display apparatus that creates different colors according to pixels, it should be understood that the structure, in which the thickness of at least one of a first layer and an interlayer varies according to pixels, is also within the scope of the present invention.

Hereinafter, the aspects of the present invention will be described more specifically, with reference to the following examples.

EXAMPLES

Synthesis Example 1

8.865 g of methyl trimethoxysilane (MTMS) and 3.406 g of bis(triethoxysilyl)ethane (BTESE) (the molar ratio of MTMS to BTESE was 5:5) were dissolved in 26.831 g of THF, used as a solvent, and a diluted solution, of 0.75 ml of 2N HCl in 8.31 g of water as a catalyst, was gradually added thereto. The concentration of the monomers MTMS and BTESE was adjusted to 30 wt %, and the total amount of the monomers MTMS and BTESE was adjusted to 0.05 moles. In the resultant products, the ratio of —OH to an alkoxy group was measured by NMR, to determine a binding ratio of MTMS to BTESE. The NMR results showed the synthesis of polysilsesquioxane-based copolymers having a weight average molecular weight of about 5100, and a number average molecular weight of 2750, in which —O—, —CH$_2$— and —CH$_2$CH$_2$— were present as linking groups between two different silicon atoms, and a methoxy group, a methyl group, an ethoxy group, and a hydroxyl group were present as end groups. The NMR results were as follows:

1H-NMR(300 MHz, Acetone-d6) δ:6.74-5.42(br, Si—OH), 3.86-3.78(m, —OCH$_3$), 3.55(br, —OCH$_2$CH$_3$, 1.22-1.20(br, —OCH$_2$CH$_3$), 0.84(br, Si—CH$_2$—CH$_2$—Si), 0.11(br, Si—CH$_3$)

Synthesis Example 2

Polysilsesquioxane-based copolymers (weight average molecular weight: 4200, number average molecular weight: 2200) were synthesized in the same manner as in Synthesis Example 1, except that the molar ratio of MTMS to BTESE was adjusted to 9:1.

Synthesis Example 3

Polysilsesquioxane-based copolymers (weight average molecular weight: 8600, number average molecular weight: 2350) were synthesized in the same manner as in Synthesis Example 1, except that the molar ratio of MTMS to BTESE was adjusted to 8:2.

Synthesis Example 4

Polysilsesquioxane-based copolymers (weight average molecular weight: 6300, number average molecular weight: 2400) were synthesized in the same manner as in Synthesis Example 1, except that the molar ratio of MTMS to BTESE was adjusted to 7:3.

Synthesis Example 5

Polysilsesquioxane-based copolymers (weight average molecular weight: 4000, number average molecular weight: 1550) were synthesized in the same manner as in Synthesis Example 1, except that the molar ratio of MTMS to BTESE was adjusted to 3:7.

Synthesis Example 6

Polysilsesquioxane-based copolymers (weight average molecular weight: 5600, number average molecular weight: 2400) were synthesized in the same manner as in Synthesis Example 1, except that the molar ratio of MTMS to BTESE was 1:9.

Synthesis Example 7

Polysilsesquioxane-based copolymers (weight average molecular weight: 5300, number average molecular weight: 2800) were synthesized in the same manner as in Synthesis Example 1, except that only BTESE was used (no MTMS).

Evaluation Example 1

The moduli and hardnesses of films, formed of the polysilsesquioxane-based copolymers obtained in Synthesis Examples 1-7, are summarized in Table 1 below.

TABLE 1

| Synthesis Example No: | Monomers | Modulus (GPa) | Hardness (GPa) |
|---|---|---|---|
| 2 | MTMS/BTESE(9:1) | 7.99 | 1.21 |
| 3 | MTMS/BTESE(8:2) | 11.74 | 1.57 |
| 4 | MTMS/BTESE(7:3) | 14.86 | 1.94 |
| 1 | MTMS/BTESE(5:5) | 18.17 | 2.32 |
| 5 | MTMS/BTESE(3:7) | 23.47 | 2.74 |
| 6 | MTMS/BTESE(1:9) | 26.51 | 3.05 |
| 7 | MTMS/BTESE(0:10) | 28.79 | 3.19 |

Figure 14:
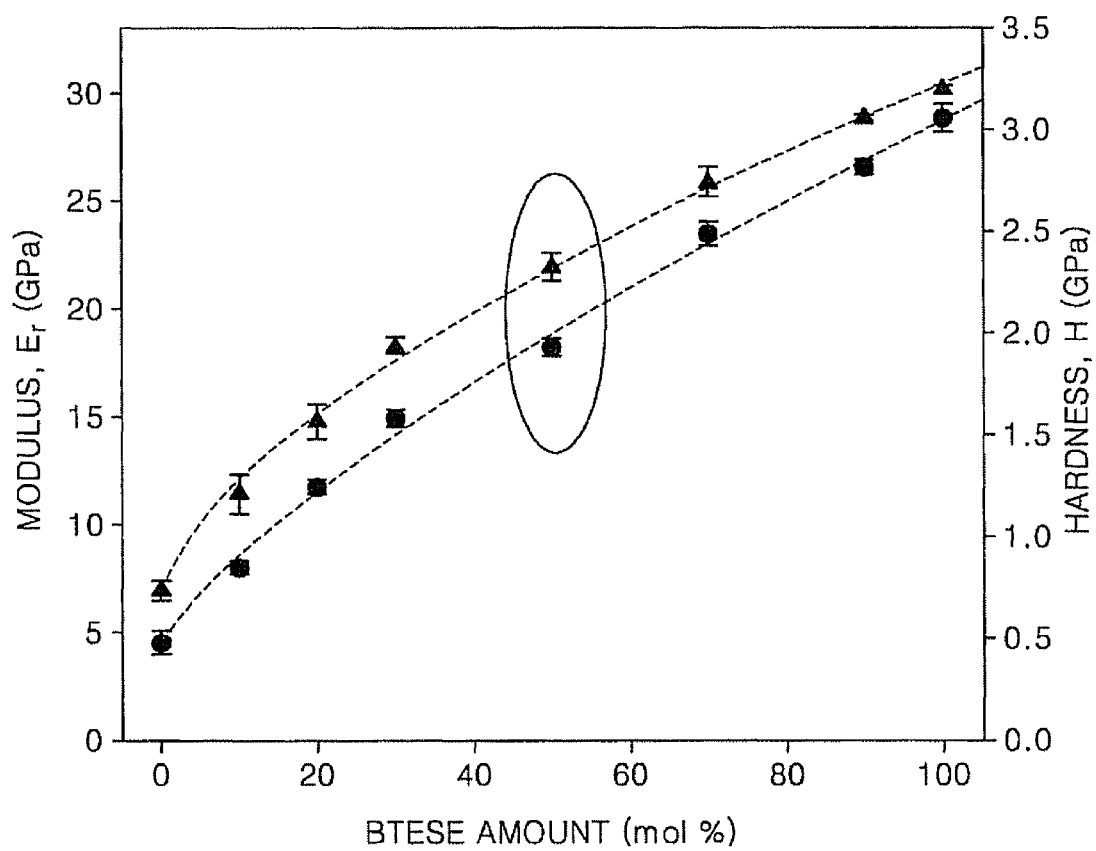
FIG. 14 is a view illustrating the modulus and hardness of a polysilsesquioxane-based copolymer, according to an exemplary embodiment of the present invention.

The moduli and hardnesses of the films, formed of the polysilsesquioxane-based copolymers obtained in Synthesis Examples 1-7, are also illustrated in FIG. 14. Taking into consideration that a polysilsesquioxane polymer containing only a —(Si—O—Si)— bond has a modulus of about 4.54 GPa, and a hardness of about 0.74 GPa, the results of Table 1 and FIG. 14 show that the use of a polysilsesquioxane-based copolymer, according to aspects of the present invention, can produce a film with a good durability.

Figure 15:
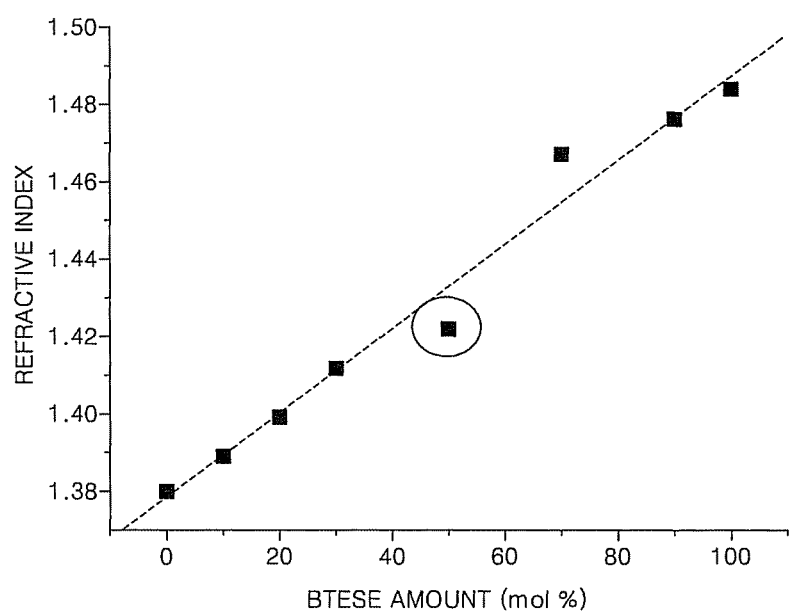
FIG. 15 is a view illustrating the refractive index of a polysilsesquioxane-based copolymer, according to an exemplary embodiment of the present invention.

Meanwhile, the refractive indices, of the films formed of the polysilsesquioxane-based copolymers obtained in Synthesis Examples 1-7, are illustrated in FIG. 15. Referring to FIG. 15, it was determined that a polysilsesquioxane-based copolymer, according to aspects of the present invention, has a refractive index of about 1.3 to 1.5.

Evaluation Example 2

Figure 16A:
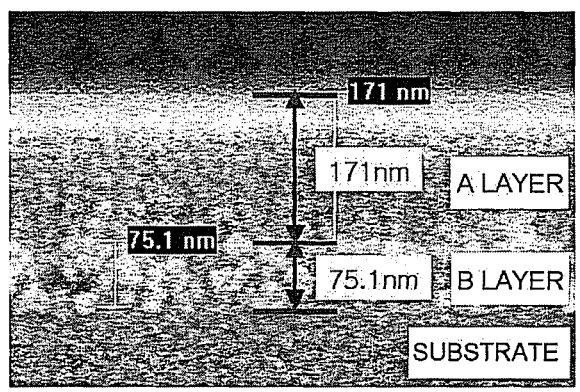
FIGS. 16A and 16B are transmission electron microscope (TEM) images showing a conventional polysilsesquioxane polymer layer, before and after forming an ITO layer, respectively.
Figure 16B:
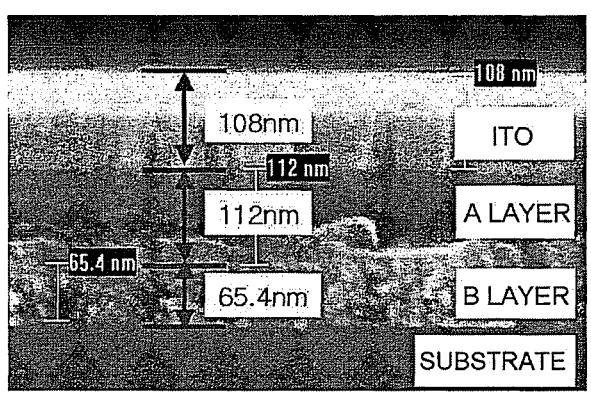

Glass substrates, on which TiO$_2$ layers (see B layer of FIG. 16A) were formed to a thickness of 75.1 nm, were prepared. Then, a mixture, including a polysilsesquioxane polymer (a linking group between two different silicon atoms was —O—, which was represented by —(Si—O—Si)$_n$—), and solvents, i.e. methyl isobutyl ketone (MIBK), N-methyl-2-pyrrolidone (NMP), propylene glycol methyl ether acetate (PGMEA), and propylene glycol monomethylether (PGME), was spin-coated on the TiO$_2$ layers. The resultant structures were thermally treated at 400° C., for 60 minutes, to form polysilsesquioxane polymer layers with a thickness of 171 nm (see A layer of FIG. 16A). The profile of the resultant structures is shown in FIG. 16A. Then, ITO layers were formed on the polysilsesquioxane polymer layers, by sputtering, and the resultant structures were designated as "samples A". In the samples A, the thickness of the polysilsesquioxane polymer layers was again measured (see FIG. 16B). Referring to FIG. 16B, the thickness of the polysilsesquioxane polymer layers (see A layer of FIG. 16B), after forming the ITO layers, was 112 nm, which was reduced by about 35%, or more, as compared to the thickness of the polysilsesquioxane polymer layers before forming the ITO layers.

Figure 17A:
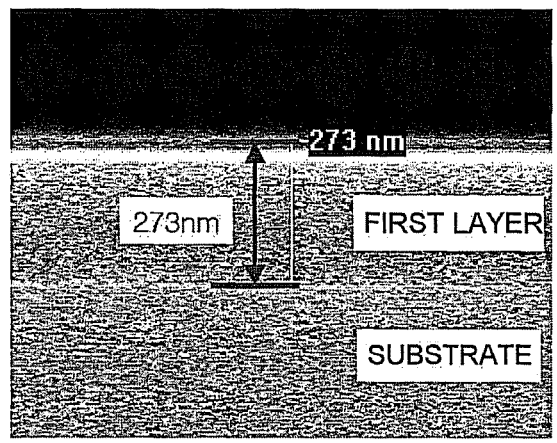
FIGS. 17A and 17B are TEM images showing a polysilsesquioxane-based copolymer layer, according to an exemplary embodiment of the present invention, before and after forming an ITO layer, respectively.
Figure 17B:
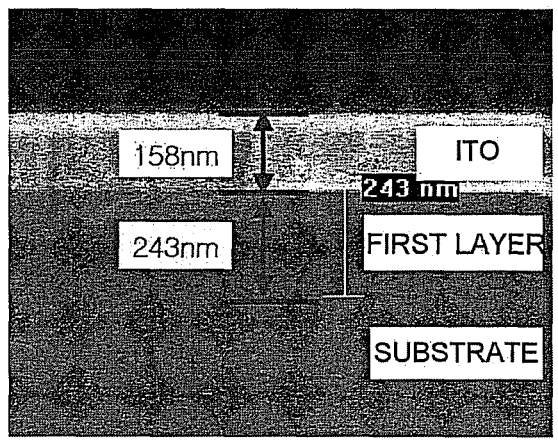

A mixture, of the polysilsesquioxane-based copolymers obtained in Synthesis Example 1 and the above-described solvents, was spin-coated on glass substrates. The resultant structures were thermally treated at 400° C., for 60 minutes, to form polysilsesquioxane-based copolymer layers with a thickness of 273 nm (see first layer of FIG. 17A). Then, ITO layers were formed on the polysilsesquioxane-based copolymer layers, by sputtering, and the resultant structures were designated as "samples 1". In the samples 1, the thickness of the polysilsesquioxane-based copolymer layers was again measured. As a result, the thickness of the polysilsesquioxane-based copolymer layers, after forming the ITO layers, was 243 nm, which was reduced by about 11%, or less, as compared to the thickness of the polysilsesquioxane-based copolymer layers before forming the ITO layers (see FIG. 17B).

The above results show that a first layer including a polysilsesquioxane-based copolymer, according to aspects of the present invention, exhibits a small thickness reduction, even when an ITO layer is formed on the first layer.

Evaluation Example 3

Figure 18A:
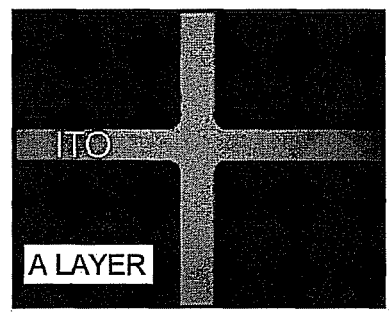
FIGS. 18A, 18B, and 18D are electron microscope images showing a conventional polysilsesquioxane polymer layer after being immersed in a KOH solution.
Figure 18B:
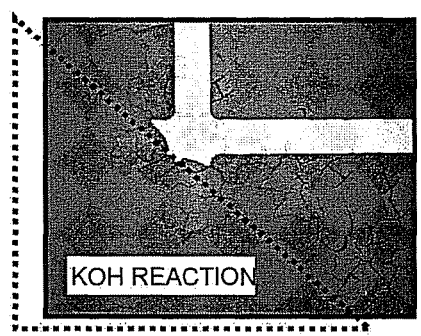
Figure 18C:
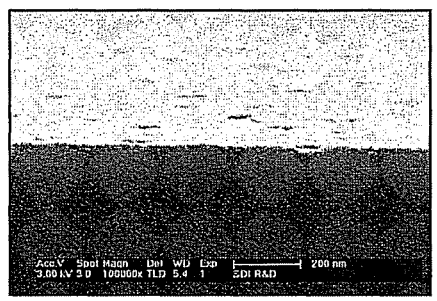
FIG. 18C is a TEM image showing the conventional polysilsesquioxane polymer layer after being immersed in the KOH solution.
Figure 18D:
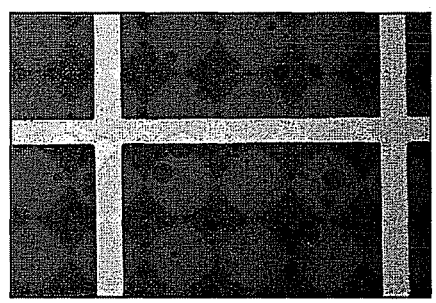

With respect to the samples A obtained in Evaluation Example 2, the ITO layers were patterned using a conventional dry etching process, as illustrated in FIG. 18A, and immersed in a 50° C., 10 wt % KOH solution, for 10 minutes. As a result, referring to FIG. 18B, the ITO layers were partially delaminated. Referring to FIGS. 18C and 18D, pinholes were observed on surfaces of the polysilsesquioxane polymer layers (FIG. 18C shows a profile of the polysilsesquioxane polymer layers). This can be explained by the polysilsesquioxane polymer layers of the samples A being dissolved in the KOH solution.

Figure 19A:
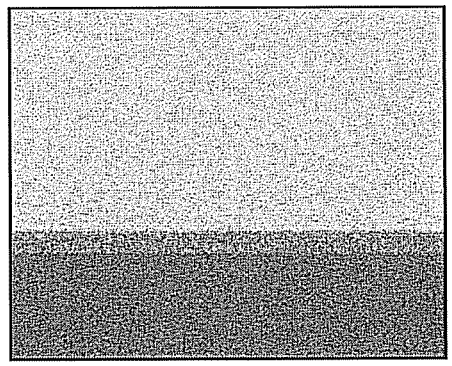
FIG. 19A is a TEM image showing a polysilsesquioxane-based copolymer layer, according to an exemplary embodiment of the present invention, after being immersed in a KOH solution.
Figure 19B:
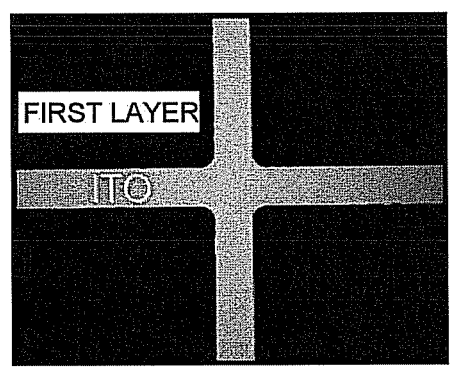
FIG. 19B is an electron microscope image showing the polysilsesquioxane-based copolymer layer, according to the exemplary embodiment of the present invention, after being immersed in the KOH solution.

The same experiment was performed for the samples 1 obtained in Evaluation Example 1. That is, the ITO layers were patterned using a conventional dry etching process, and immersed in a 50° C., 10 wt % KOH solution, for 10 minutes. The results are shown in FIGS. 19A and 19B. Referring to FIG. 19A, no change was observed on surfaces of the polysilsesquioxane-based copolymer layers (the first layer of FIG. 19A). Referring to FIG. 19B, no delamination of the ITO layers occurred. This can be explained by the polysilsesquioxane-based copolymer layers of the samples 1 having a chemical resistance to KOH.

Example 1

50 mm×50 mm test cells, including four emission areas of 2 mm×3 mm in size, were manufactured. First, glass substrates were cleaned. Then, $TiO_2$ used as a second layer material was spin-coated on the glass substrates, and thermally treated at 400° C., for one hour, to form second layers with a thickness of 80 nm. A mixture, including the polysilsesquioxane-based copolymers obtained in Synthesis Example 1 and the above-described solvents, was spin-coated on the second layers. The resultant structures were thermally treated at 400° C., for one hour, to form first layers with a thickness of 160 nm. Then, ITO layers were formed to a thickness of 80 nm, on the first layers, using sputtering, and emission areas were formed by a conventional pixel patterning process using polyimide. Organic layers and electrodes, of organic light-emitting devices, were formed in the emission areas, and sealed with glass substrates, to complete organic light-emitting devices.

Example 2

Organic light-emitting devices were manufactured in the same manner as in Example 1, except that the first layers were formed to a thickness of 180 nm, instead of 160 nm.

Example 3

Organic light-emitting devices were manufactured in the same manner as in Example 1, except that the first layers were formed to a thickness of 200 nm, instead of 160 nm.

Example 4

Organic light-emitting devices were manufactured in the same manner as in Example 1, except that the first layers were formed to a thickness of 220 nm, instead of 160 nm.

Comparative Example 1

Organic light-emitting devices were manufactured in the same manner as in Example 1, except that the first layers and the second layers were not formed.

Evaluation Example 4

Light efficiencies, of the organic light-emitting devices manufactured in Examples 1-4 and Comparative Example 1, were measured using a brightness measuring machine. Assuming that the light efficiencies, of the organic light-emitting devices manufactured in Comparative Example 1, were 100%, the ratios (%), of the light efficiencies of the organic light-emitting devices manufactured in Examples 1-4, to the light efficiencies of the organic light-emitting devices manufactured in Comparative Example 1, were summarized in Table 2 below.

TABLE 2

|  | Enhancement (%) in red light-emitting efficiency | Enhancement (%) in green light-emitting efficiency | Enhancement (%) in blue light-emitting efficiency |
| --- | --- | --- | --- |
| Example 1 | 142 | 100 | 137 |
| Example 2 | 168 | 105 | 105 |
| Example 3 | 142 | 89 | 121 |
| Example 4 | 101 | 88 | 141 |

The results of Table 2 show that the light efficiency of an organic light-emitting device, according to aspects of the present invention, is greater than that of a conventional organic light-emitting device, for red, green, and blue light-emission.

Example 5

Glass substrates were cleaned. Then, $Si_3N_4$ used as a second layer material was deposited on the glass substrates, using PECVD, and etched using a conventional dry etching process (using photoresist as an etching mask), to form second layers. The thickness of portions of the second layers corresponding to red subpixel regions, was 380 nm, the thickness of portions of the second layers corresponding to green subpixel regions, was 240 nm, and the thickness of portions of the second layers corresponding to blue subpixel regions, was 240 nm. Then, a mixture, including the polysilsesquioxane-based copolymers obtained in Synthesis Example 1 and the above-described solvents, was spin-coated on the second layers. The resultant structures were thermally treated at 400° C., for one hour, to form first layers. The thickness of portions of the first layers corresponding to the red subpixel regions, was 180 nm, the thickness of portions of the first layers corresponding to the green subpixel regions, was 320 nm, and the thickness of portions of the first layers corresponding to the blue subpixel regions, was 320 nm. Then, ITO layers were formed to a thickness of 80 nm, on the first layers, by sputtering. Emission areas were formed by a conventional pixel patterning process, using polyimide. Organic layers and electrodes of organic light-emitting devices were formed in the emission areas, and sealed with glass substrates, to complete organic light-emitting devices including red, green, and blue subpixels.

Evaluation Example 5

The ratios (%) of light efficiencies, of the organic light-emitting devices manufactured in Example 5, according to the red, green, and blue subpixels, to light efficiencies of the organic light-emitting devices manufactured in Comparative Example 1, were determined, assuming that the light efficiencies, of the organic light-emitting devices manufactured in Comparative Example 1, were 100%, and the results are summarized in Table 3 below.

TABLE 3

|  | Thickness of first layer (nm) | Thickness of second layer (nm) | Efficiency (%) |
|---|---|---|---|
| Red subpixel | 180 nm | 380 nm | 258 |
| Green subpixel | 320 nm | 240 nm | 153 |
| Blue subpixel | 320 nm | 240 nm | 130 |

The results of Table 3 show that an organic light-emitting device, according to aspects of the present invention, has a good light efficiency.

As described above, an optical resonance layer of a light-emitting device, according to aspects of the present invention, includes a layer including a polysilsesquioxane-based copolymer, as described above, and thus, can achieve a very high light coupling efficiency. Moreover, the layer including the polysilsesquioxane-based copolymer has a good hardness, and thus, even when an additional layer is formed on the polysilsesquioxane-based copolymer-containing layer, film cracking does not occur. The polysilsesquioxane-based copolymer-containing layer also has a good chemical resistance to various developers, thereby producing a highly reliable light-emitting device. In addition, the polysilsesquioxane-based copolymer-containing layer can be formed using a simple method (e.g., coating), thereby simplifying a manufacturing process.

Although a few exemplary embodiments of the present invention have been shown and described, it would be appreciated by those skilled in the art that changes may be made in these exemplary embodiments, without departing from the principles and spirit of the invention, the scope of which is defined in the claims and their equivalents.

What is claimed is:

1. A light-emitting device comprising:
a substrate;
a light-emitting diode; and
an optical resonance layer to resonate light emitted from the light-emitting diode, being external to the light-emitting diode and comprising a first layer comprising a polysilsesquioxane-based copolymer having a linking group connecting two different silicon (Si) atoms of the polysilsesquioxane-based copolymer, wherein the optical resonance layer is external to the light-emitting diode,
wherein the linking group is —O—, or a substituted or unsubstituted $C_1$-$C_{30}$ alkylene group and at least one of the linking groups is a substituted or unsubstituted $C_1$-$C_{30}$ alkylene group.

2. The light-emitting device of claim 1, wherein the optical resonance layer and the light-emitting diode are sequentially stacked on the substrate, and light emitted from the light-emitting diode is extracted from the substrate, via the optical resonance layer.

3. The light-emitting device of claim 1, wherein the light-emitting diode and the optical resonance layer are sequentially stacked on the substrate, and light emitted from the light-emitting diode is extracted externally, via the optical resonance layer.

4. The light-emitting device of claim 1, wherein the linking group is —O— or a $C_1$-$C_{10}$ alkylene group and at least one of the linking groups is a substituted or unsubstituted $C_1$-$C_{10}$ alkylene group.

5. The light-emitting device of claim 1, wherein the polysilsesquioxane-based copolymer of the first layer is a product obtained by a condensation reaction between a monomer represented by Formula 1 below and a monomer represented by Formula 2 below, or a product obtained by a condensation reaction of monomers represented by Formula 2 below:

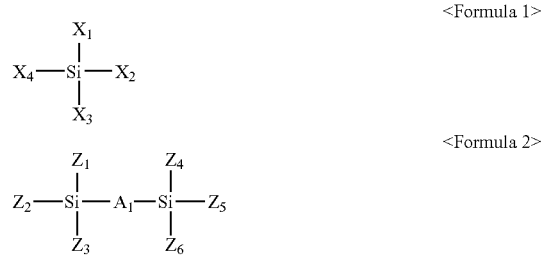

wherein $X_1$, $X_2$, $X_3$, $X_4$, $Z_1$, $Z_2$, $Z_3$, $Z_4$, $Z_5$, and $Z_6$ are each independently a hydroxyl group, a substituted or unsubstituted $C_1$-$C_{30}$ alkyl group, or a substituted or unsubstituted $C_1$-$C_{30}$ alkoxy group, and $A_1$ is a substituted or unsubstituted $C_1$-$C_{30}$ alkylene group.

6. The light-emitting device of claim 1, wherein the first layer comprising the polysilsesquioxane-based copolymer has a refractive index of from 1.3 to 1.5.

7. The light-emitting device of claim 1, wherein the first layer comprising the polysilsesquioxane-based copolymer has a modulus of from 7.5 to 30 GPa.

8. The light-emitting device of claim 1, wherein the polysilsesquioxane-based copolymer of the first layer has a weight average molecular weight of from 1,000 to 100,000.

9. The light-emitting device of claim 1, wherein the first layer further comprises a nanoporous material.

10. The light-emitting device of claim 9, wherein the nanoporous material is selected from the group consisting of nanoporous silica, silica aerogel, polycaprolactone, and a cyclodextrin.

11. The light-emitting device of claim 1, wherein the optical resonance layer further comprises a second layer having a higher refractive index than the first layer, and the first layer and the second layer are sequentially stacked, such that the second layer is further from the light-emitting diode than the first layer.

12. The light-emitting device of claim 11, wherein a refractive index difference between the first layer and the second layer is 0.2 or more.

13. The light-emitting device of claim 11, wherein the refractive index of the second layer is from 1.6 to 2.3.

14. The light-emitting device of claim 11, wherein the second layer is comprised of at least one selected from the group consisting of silicon nitride, titanium oxide, hafnium dioxide, niobium oxide, tantalum oxide, antimony oxide, benzocyclobuten (BCB), and titanium alkoxide.

15. The light-emitting device of claim 1, further comprising an interlayer between the light-emitting diode and the optical resonance layer.

16. The light-emitting device of claim 15, wherein the interlayer comprises at least one selected from the group consisting of an inorganic-organic hybrid polymer, silicon oxide, benzocyclobuten (BCB), and silicon nitride.

17. The light-emitting device of claim 1, wherein the substrate comprises at least one thin film transistor electrically connected to the light-emitting diode.

18. The light-emitting device of claim 1, wherein:
the light-emitting diode comprises red, green, and blue subpixels, respectively comprising red, green, and blue light-emitting layers; and
the thickness of a first portion of the first layer, which corresponds to the red subpixel, is different from the thickness of a second portion of the first layer, which corresponds to the green subpixel, the thickness of the second portion is different from the thickness of a third portion of the first layer, which corresponds to the blue subpixel, or the thickness of the third portion is different from the thickness of the first portion.

19. The light-emitting device of claim 18, wherein the thickness of the first portion is greater than the thickness of the second portion and the thickness of the second portion is greater than the thickness of the third portion.

20. The light-emitting device of claim 18, wherein the thickness of the first portion is greater than the thickness of the second portion and the thickness of the second portion is approximately equal to the thickness of the third portion.

21. The light-emitting device of claim 1, wherein the light-emitting diode is an organic light-emitting diode.

22. A light-emitting device comprising:
a substrate;
a light-emitting diode; and
an optical resonance layer to resonate light emitted from the light-emitting diode, comprising a first layer comprising a polysilsesquioxane-based copolymer having a linking group connecting two different silicon (Si) atoms of the polysilsesquioxane-based copolymer,
wherein the linking group is —O— or a substituted or unsubstituted $C_1$-$C_{30}$ alkylene group, wherein the polysilsesquioxane-based cool mer of the first la er is a product obtained by a condensation reaction between a monomer represented by Formula 1 below and a monomer represented by Formula 2 below, or a product obtained by a condensation reaction of monomers represented by Formula 2 below:

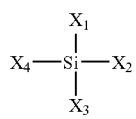

<Formula 1>

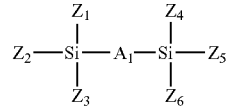

<Formula 2> wherein $X_1$, $X_2$, $X_3$, $X_4$, $Z_1$, $Z_2$, $Z_3$, $Z_4$, $Z_5$, and $Z_6$ are each independently a hydroxyl group, a substituted or unsubstituted $C_1$-$C_{30}$ alkyl group, or a substituted or unsubstituted $C_1$-$C_{30}$ alkoxy group, and $A_1$ is a substituted or unsubstituted $C_1C_{30}$ alkylene group, wherein $X_1$, $X_2$, $X_3$, $X_4$, $Z_1$, $Z_2$, $Z_3$, $Z_4$, $Z_5$, and $Z_6$ are each independently a hydroxyl group, a $C_1$-$C_{10}$, alkyl group, or a $C_1$-$C_{10}$ alkoxy group, and $A_1$ is a $C_1$-$C_{10}$ alkylene group.

23. A light-emitting device comprising:
a substrate;
a light-emitting diode; and
an optical resonance layer to resonate light emitted from the light-emitting diode, comprising a first layer comprising a polysilsesquioxane-based copolymer having a linking group connecting two different silicon (Si) atoms of the polysilsesquioxane-based copolymer,
wherein the linking. group is —O— or a substituted or unsubstituted $C_1$-$C_{30}$ alkylene group, wherein the polysilsesquioxane-based copolymer of the first layer is a product obtained by a condensation reaction between a monomer represented by Formula 1 below and a monomer represented by Formula 2 below, or a product obtained by a condensation reaction of monomers represented by Formula 2 below:

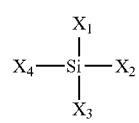

<Formula 1>

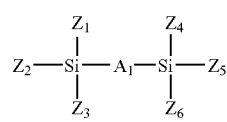

<Formula 2> wherein $X_1$, $X_2$, $X_3$, $X_4$, $Z_1$, $Z_2$, $Z_3$, $Z_4$, $Z_5$, and $Z_6$ are each independently a hydroxyl group, a substituted or unsubstituted $C_1$-$C_{30}$ alkyl group, or a substituted or unsubstituted $C_1$-$C_{30}$ alkoxy group, and $A_1$ is a substituted or unsubstituted $C_1$-$C_{30}$ alkylene group, wherein the polysilsesquioxane-based copolymer of the first layer is a product obtained by a condensation reaction between the monomer represented by Formula 1 and the monomer represented by Formula 2 at a molar ratio of from 1:9 to 9:1.

* * * * *